United States Patent [19]
Takeuchi

[11] Patent Number: 5,155,408
[45] Date of Patent: Oct. 13, 1992

[54] PIEZOELECTRIC TRANSDUCER HAVING PIEZOELECTRIC ELEMENTS FREE FROM STRESS CONCENTRATIONS

[75] Inventor: Kiyoshi Takeuchi, Kanagawa, Japan

[73] Assignee: Nissan Motor Company, Limited, Yokohama, Japan

[21] Appl. No.: 576,588

[22] Filed: Sep. 4, 1990

[30] Foreign Application Priority Data

Sep. 7, 1989 [JP] Japan .................................. 1-230316

[51] Int. Cl.$^5$ ............................................. H01L 41/08
[52] U.S. Cl. .................... 310/339; 310/328; 310/329; 310/333; 310/345
[58] Field of Search ............... 310/328, 333, 338, 339, 310/800, 329, 345

[56] References Cited

U.S. PATENT DOCUMENTS 4,158,117 6/1979 Quilliam et al. .................... 310/800

FOREIGN PATENT DOCUMENTS 3210438 9/1983 Fed. Rep. of Germany ...... 310/328

Primary Examiner—Mark O. Budd
Attorney, Agent, or Firm—Foley & Lardner

[57] ABSTRACT

A piezoelectric transducer comprising first and second members in axial alignment and spaced apart, the first and second members being mutually displaceable toward and away from each other, and a transducer assembly disposed between the first and second members. The assembly includes a stationary means (first member), a piezoelectric element facing the stationary means on its entire surface, and a force converting means (second member) for generating a transverse force in direction radially outward from a center axis, facing the piezoelectric element at entire surface. The stationary means, the piezoelectric element and the force converting means are contained sequentially between the first and the second member.

11 Claims, 3 Drawing Sheets

PIEZOELECTRIC TRANSDUCER HAVING PIEZOELECTRIC ELEMENTS FREE FROM STRESS CONCENTRATIONS

BACKGROUND OF THE INVENTION

1. Field of the Invention

The present invention relates to a piezoelectric transducer. Specifically, the present invention relates to a piezoelectric transducer utilizing piezoelectric elements, such as employed for an automotive control system. More specifically, the present invention relates to a piezoelectric transducer utilizing piezoelectric elements adapted for an automotive combustion sensor.

2. Disclosure of the Prior Art

Japanese Utility Model First Publication No. 53-147666 discloses a common piezoelectric transducer. The transducer comprises two cylindrically formed piezoelectric elements which are laminated with an electrode plate sandwiched therebetween, of which the shape is similar to the piezoelectric elements, an inner support means installed substantially around the inner circumference of the device and an outer support means installed substantially around the outer circumference thereof. Both support means are formed of hard resin or metal. The inner support means has a flange portion adhered to the inner surface of an upper press means.

On the other hand, the outer support means has a flange portion adhered to the inner surface of a lower press means, the upper and lower press means being arranged to oppose each other. Both support means are installed to provide a transformation mode for the laminated piezoelectric elements. Electric power is obtained by a shearing stress, which is applied to the piezoelectric elements when they are subjected to outer pressure in direction perpendicular to the laminated surfaces. As mechanical strength is raised by this support structure, electric power is produced even under relatively high pressure.

However, in this structure, the inner and outer flange portions are installed a little offset from the inner and the outer support means. Therefore, stress concentration frequently occurs where the flanges are not adhered to the elements. At this point, the piezoelectric transducer can not constantly provide electric power and, therefore, reliability of the transducer is relatively low.

SUMMARY OF THE INVENTION

It is therefore the principal object of the present invention to provide a piezoelectric transducer utilizing piezoelectric elements which are free from stress concentration.

It is additional object of the present invention to provide a piezoelectric transducer having pressure resistance at elevated pressure.

It is further object of the present invention to provide a piezoelectric transducer utilizing piezoelectric elements which can produce electric power constantly.

It is, furthermore, an object of the present invention to provide a piezoelectric transducer of high reliability.

A piezoelectric transducer of the present invention comprises first and second members axially aligned and spaced apart, the first and second members being mutually displaceable toward and away from each other, a transducer assembly disposed between the first and second members, wherein the assembly is composed of; a stationary means having a first and second surface at opposite sides being fitted to an inner surface of the first member; a piezoelectric element having a pair of electrodes on a first and second surfaces of the element, the first surface of the element facing the second surface of the stationary means at entire surface; and a force converting means for generating a transverse force in direction radially outward from a center axis, a first surface of the force converting means facing the second surface of the piezoelectric element on its entire surface, and a second surface of the force converting means fitted to the second member.

The force converting means may have a plurality of slits in an outer circumference of the means to allow outward expansion from the center thereof when the first and second members are pressurized in an axial direction.

The electrodes may be connected with outputs to induce electric power which produced by shearing piezoelectric effect of the piezoelectric element.

Preferably, the stationary means is formed of iron having an elastic modulus of less than or equal to 20,000 kg/mm$^2$, and the force converting means is formed of synthetic resin having elastic modulus less than or equal to 100 kg/mm$^2$.

The force converting means may be shaped so as to shrink inwardly from the circumference of the means when pressurized, and it may be formed of synthetic resin having elastic modulus less than or equal to 100 kg/mm$^2$.

Alternatively, the force converting means may be formed of resin having a high Poisson's ratio installed on a conically shaped mounting projecting towards direction toward which the force converting means is connected, to allow the force converting means an outward expansion from the center axis of the force converting means.

Otherwise, the force converting means may also be formed of resin having a high Poisson's ratio installed on a conically inward cut-out mounting, to allow inward expansion from the circumference of the force converting means. In the above two cases, a material for the force converting means can be selected from resins of silicon rubber.

BRIEF DESCRIPTION OF THE DRAWINGS

The present invention will be understood from the detailed description given hereinbelow and from the accompanying drawings of the preferred embodiments which are given for explanation and understanding only and are not intended to imply limitation to the invention.

In the drawings.

DETAILED DESCRIPTION OF THE PREFERRED EMBODIMENT

The preferred embodiment of the present invention will now be described in detail with reference to FIGS. 1 to 3.

Figure 1:
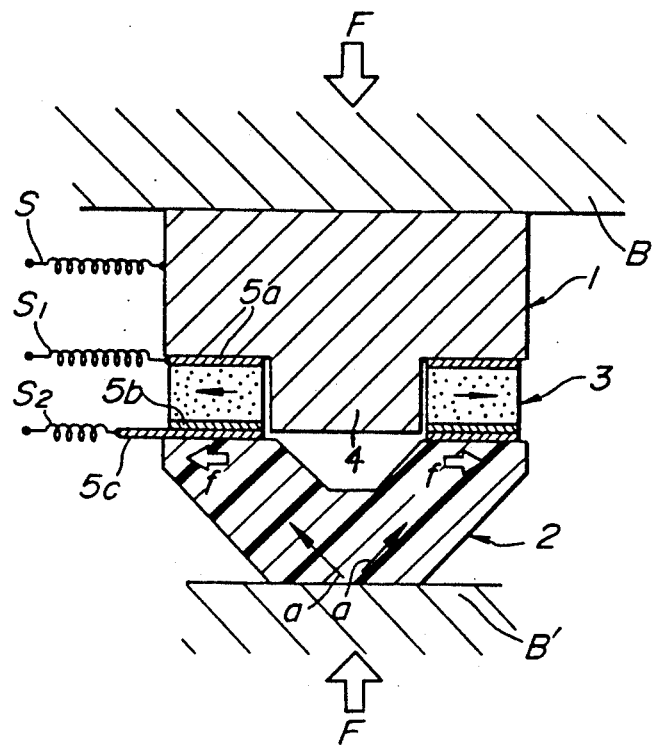
FIG. 1 is a cross sectional view of a piezoelectric transducer according to the present invention.

Referring now to FIG. 1, a stationary means 1 and a force converting means 2 are arranged to sandwiching a piezoelectric element 3 therebetween, the stationary means 1, the piezoelectric element 3 and the force converting means 2, being laminated sequentially, top to bottom.

The stationary means 1 is shaped cylindrically and formed of iron having elastic modulus of less than or equal to 20,000 kg/mm$^2$, and is connected to an output S. The stationary means 1 is adhered to an upper base B, which is a displaceable member, by pressurizing, and a projection 4 extends from the stationary means 1 into a central opening of the piezoelectric element 3 at a side opposite that side fitted to the member.

The piezoelectric element 3 has a piezoelectric shearing effect in a horizontal direction thereof when it is subjected to pressure from a perpendicular direction, formed cylindrically, and substantially surrounding the projection 4 of the stationary means 1. Thus, movement of the element 3 in horizontal direction is restricted. Electrodes 5a and 5b are formed at an upper and lower surfaces of the element 3, an output S1 is connected with the upper electrode 5a and lower electrode 5b is fitted to an electrode 5c formed of a conductive plastic having relatively small elastic modulus, the electrode 5c being connected with an output S2. The electrode 5a is fitted substantially to the whole area on the upper surface of the piezoelectric element 3, and is concurrently in contact with the inner surface of the stationary means 1. On the other side, the electrode 5c is in contact with a support area of the force converting means 2. Thus the upper and the lower sides of the piezoelectric element 3 are supported by the stationary means 1 and the force converting means 2.

The force converting means 2 is shaped as a disc spring of which a cross section appears V-shaped and is formed of synthetic resin having a small elastic modulus of less than or equal to 100 kg/mm$^2$. An upper surface of the force converting means 2 is fitted to the lower surface of the piezoelectric element 3 and forms a support surface for the element 3. On the other side, an lower surface of the force converting means 2 is fitted to a lower base B'. When pressure is applied to the construction from the upper and lower directions, the force converting means 2 is pressed by the upper constituents. Therefore, a force towards the upper direction produced in the force converting means 2 is dispersed as a traverse force in a direction radially outward from a center axis of the force converting means 2. A plurality of slits 6 are made in the outer circumference of the force converting means 2 at constant intervals for providing expandability for the out side of the force converting means 2 so as to expand in a direction radially outward from the center.

The piezoelectric transducer composed as mentioned above operates as follows;

When pressure F is input from the lower base B', the support surface of the force converting means 2 is expanded and crushed outwardly, therefore the transverse force traveling radially outward from the center axis of the means 2 is produced. The transverse force acts to expand the support surface outwardly, concurrently contacting the lower surface of the piezoelectric element 3. Thus, radially outward force f is applied to the piezoelectric element 3. The force f applied to the element 3 is transduced to electric power corresponding the piezoelectric constant d$_{15}$.

Additionally, the upper surface of the element 3 is held by the lower surface of the stationary means 1 and the lower surface of element 3 supported by the expanded force converting means 2. Therefore the piezoelectric element 3 is substantially supported, and stress concentration does not occur. Thus, a constant level of electric power can be obtained with high reliability.

Figure 2:
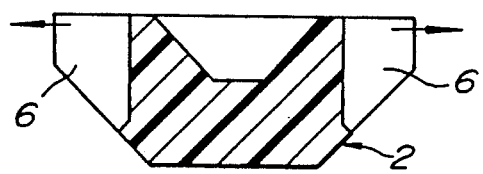
FIG. 2 is a cross sectional view of a force converting means (means for producing a component force) which is situated in the piezoelectric transducer of the present invention.
Figure 3:
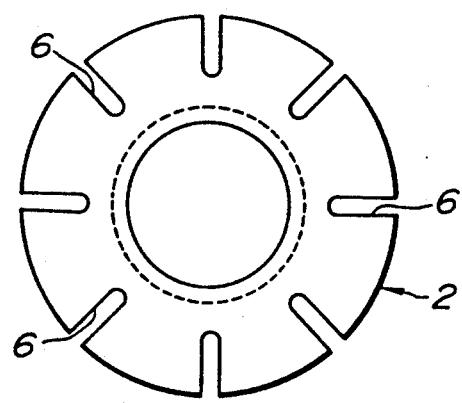
FIG. 3 is a plan view of the force converting means of FIG. 2.
Figure 4:
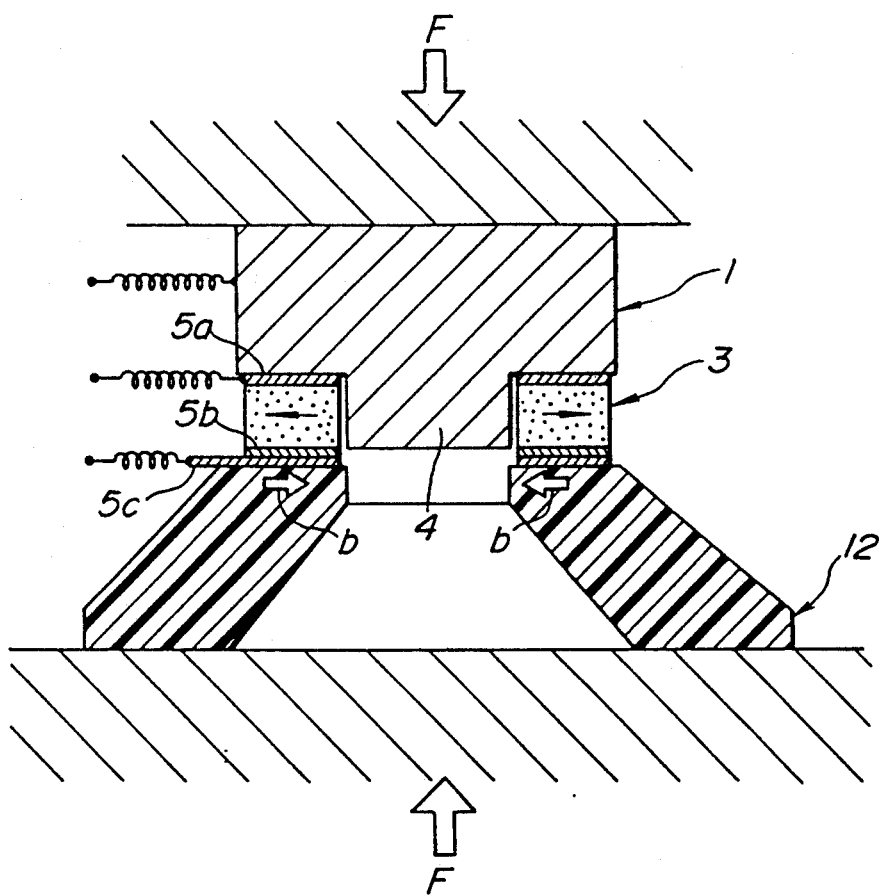
FIG. 4 is a cross sectional view of a piezoelectric transducer according to the second embodiment of the present invention.

Referring now to FIG. 4 showing the second embodiment of the present invention, a force converting means 12 having an inverted-V shaped disc spring which is formed upside down from that of the force converting means 2 of the first preferred embodiment of FIGS. 1 to 3. An upper surface of the means 12 is fitted to a lower surface of the piezoelectric element 3, then pressurizing force F is transduced to shrinking force b in direction of radially inward from a circumference of the force converting means 12. It is also effective for this construction to made plural slits in an inner circumference of a force converting means 12. Electric power can be obtained under high reliability, similarly to the embodiment of FIG. 1.

Figure 5:
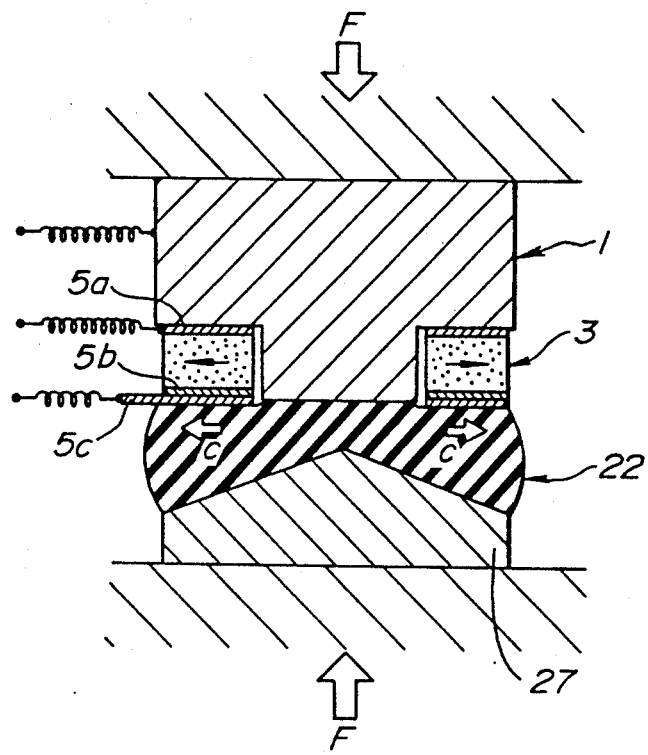
FIG. 5 is a view similar to FIG. 4 but according to the third embodiment of the present invention.
Figure 6:
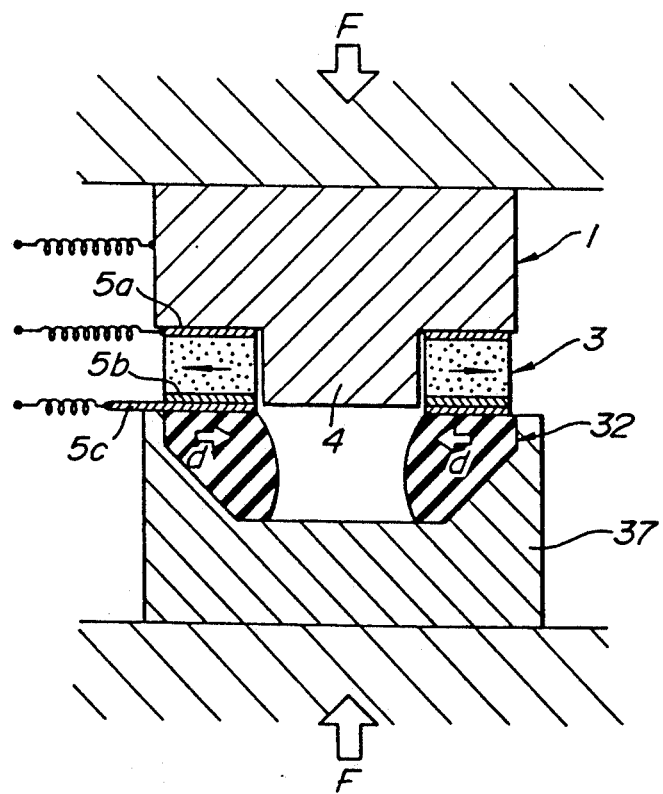
FIG. 6 is a view similar to FIG. 4 but according to the forth embodiment of the present invention.

Referring now to FIG. 5 according to a third embodiment of the present invention, replacing a force converting means by utilizing substance having high Poisson's ratio, such as silicon rubber, is possible to obtain the similar effects of embodiments in FIGS. 1 and 4. In this case, the force converting means 22 which formed of elastic substance is installed on a tapered mounting 27 conically projecting toward the element 3. Under pressure, the mounting 27 presses the elastic substance to the piezoelectric element 3 to apply radially outward shearing force c corresponding to the radially outward expandability according to the axial stress applied to the elastic substance 22. Forming a taper on the mounting 27 is not strictly necessary, but radial outward expansion of elastic substance 22 can be achieved more easily. Alternatively, the upper surface of the mounting 37 may be cut out so as to form the taper inwardly as shown in FIG. 6. The elastic substance 32 may be formed cylindrically in this case, and installed on the mounting 37 so as to contact substantially with the piezoelectric element 3. When pressurized, the mounting 37 presses the elastic substance 32 towards the piezoelectric element 3 to apply radial shearing force d corresponding to pressure in a direction radially inward from the circumference of the element 3.

According to the present invention, stress concentration of the piezoelectric element can be avoided by uniform application of pressure, because the element surface is substantially surrounded by the stationary means and the force converting means. Therefore, cracking of the piezoelectric element can be avoided, thus the reliability of the piezoelectric transducer can be highly increased.

Additionally, as the piezoelectric element is pressed uniformly, the element will resist damage even if subject to high pressures.

Further to say, the uniform application of pressure to the piezoelectric element causes a constant shearing force to be produced by converting pressurizing force to transverse force which results in a radially outward or inward direction of force using the force converting means having plurality of slits so as to allow the means radial expansion. Therefore, electric power produced at the piezoelectric element by the applied shearing force becomes constant, thus the piezoelectric transducer of the present invention can be operated with high reliability.

Thus, requests for accuracy in construction or manufacturing can be met and, further, manufacturing costs can be reduced.

The piezoelectric transducer according to the present invention can be applied to a pressure sensor or an acceleration sensor.

While the present invention has been disclosed in terms of the preferred embodiment in order to facilitate better understanding thereof, it should be appreciated that the invention can be embodied in various ways without departing from the principle thereof. Therefore, the invention should be understood to include all possible embodiments and modifications to shown embodiments which can be embodied without departing from the principle of the invention as set out in the appended claims.

What is claimed is:

1. A piezoelectric transducer comprising:
   first and second members arranged in axial alignment and spaced apart, said first and second members being mutually displaceable toward and away from each other;
   a transducer assembly disposed between said members to provide a sequential placement of said first member, said assembly and said second member, wherein said assembly includes;
   a stationary means having a first and a second surface at opposite sides of the transducer assembly, the first surface being fitted to one surface of the first member and the second surface partially projecting in a direction opposite from said first surface on which said first member is fitted;
   a piezoelectric element having a pair of electrodes on a first and a second surface of said element, the first surface of the element fully facing the second surface of said stationary means, wherein lateral movement of said element in relation to the axis of said alignment is restricted by providing a substantial engagement with the second surface of said stationary means; and
   a force converting means having a first surface fully facing the second surface of said piezoelectric element being deformed thereby in a radial direction in relation to a center axis of the alignment for generating a transverse force in a lateral direction in relation to the axis of said alignment, a second surface of said force converting means being fitted to the second member.

2. A piezoelectric transducer as set forth in claim 1, wherein said force converting means has a plurality of slits in the outer circumference of said means to allow outward expansion from the center thereof when said transducer is pressurized in the axial direction of the alignment.

3. A piezoelectric transducer as set forth in claim 1, wherein said electrodes are connected with a pair of outputs to output electric power which is generated by a piezoelectric shearing effect of said piezoelectric element.

4. A piezoelectric transducer as set forth in claim 1, wherein said stationary means is formed of iron having an elastic modulus of less than or equal to 20,000 kg/mm$^2$.

5. A piezoelectric transducer as set forth in claim 1, wherein said force converting means is formed of synthetic resin having an elastic modular of less than or equal to 100 kg/mm$^2$.

6. A piezoelectric transducer as set forth in claim 1, wherein said force converting means has a shape to allow inward deformation from the circumference thereof when said transducer is pressurized in the axial direction of the alignment.

7. A piezoelectric transducer as set forth in claim 6, wherein said force converting means is formed of synthetic resin having an elastic modulus of less than or equal to 100 kg/mm$^2$.

8. A piezoelectric transducer as set forth in claim 1, wherein said force converting means is formed of a resin having a high Poisson's ratio is installed on a conically shaped mounting, the force converting means projecting towards a direction of said force wherein said force converting means expands outwardly from its center axis when said transducer is pressurized in the axial direction of the alignment.

9. A piezoelectric transducer as set forth in claim 1, wherein said force converting means is formed of a resin having a high Poisson's ratio installed on a inwardly conically shaped cut-out mounting being compressed inwardly from its circumference when said transducer is pressurized in the axial direction of the alignment.

10. A piezoelectric transducer as set forth in claim 8, wherein said resin is silicon rubber.

11. A piezoelectric transducer as set forth in claim 9 wherein said resin is silicon rubber.

* * * * *